United States Patent
Qiao et al.

(10) Patent No.: US 12,014,791 B2
(45) Date of Patent: Jun. 18, 2024

(54) MEMORY FAULT HANDLING METHOD AND APPARATUS, DEVICE, AND STORAGE MEDIUM

(71) Applicant: HUAWEI TECHNOLOGIES CO., LTD., Guangdong (CN)

(72) Inventors: Guangyi Qiao, Chengdu (CN); Yangbin Diao, Chengdu (CN); Jiantao Ma, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 74 days.

(21) Appl. No.: 17/582,802

(22) Filed: Jan. 24, 2022

(65) Prior Publication Data
US 2022/0148674 A1    May 12, 2022

Related U.S. Application Data

(63) Continuation of application No. PCT/CN2020/126112, filed on Nov. 3, 2020.

(30) Foreign Application Priority Data

Jun. 20, 2020    (CN) .......................... 202010569797.2
Oct. 29, 2020    (CN) .......................... 202011179463.0

(51) Int. Cl.
*G11C 29/44*    (2006.01)
*G11C 29/00*    (2006.01)
(Continued)

(52) U.S. Cl.
CPC ...... *G11C 29/4401* (2013.01); *G11C 29/1201* (2013.01); *G11C 29/38* (2013.01); *G11C 29/78* (2013.01)

(58) Field of Classification Search
None
See application file for complete search history.

(56) References Cited

U.S. PATENT DOCUMENTS 4,899,342 A    2/1990    Potter et al.
6,408,401 B1 *    6/2002    Bhavsar ............... G11C 29/006
                                                                714/6.32
(Continued)

FOREIGN PATENT DOCUMENTS

CN    1598780 A *    3/2005
CN    101329918 A    12/2008
(Continued)

OTHER PUBLICATIONS

PCT International Search Report and Written Opinion issued in International Application No. PCT/CN2020/126112 dated Mar. 24, 2021, 14 pages (with English translation).
(Continued)

*Primary Examiner* — Guerrier Merant
(74) *Attorney, Agent, or Firm* — Fish & Richardson P.C.

(57) ABSTRACT

The present disclosure provides example memory fault handling method, computer device, and computer-readable storage medium. One example method includes starting fault analysis for a memory at a first moment, where the fault analysis includes obtaining a current fault analysis result of the memory by analyzing historical fault information, the historical fault information includes fault information of the memory accumulated in a historical time period, and the historical time period is a time period before the first moment or a time period before the first moment and including the first moment. Fault recovery is started for the memory based on the current fault analysis result of the memory.

19 Claims, 6 Drawing Sheets

---

Start fault analysis for a memory at a first moment, where the fault analysis includes: obtaining a current fault analysis result of the memory by analyzing historical fault information — 501

Start fault recovery for the memory when a fault mode is a memory bank fault, where the fault recovery includes: replacing a faulty bank with a redundant bank, and recovering data in the redundant bank — 502

(51) Int. Cl.
*G11C 29/12* (2006.01)
*G11C 29/38* (2006.01)

(56) References Cited

U.S. PATENT DOCUMENTS

| | | |
|---|---|---|
| 2002/0181303 A1 | 12/2002 | Kato et al. |
| 2010/0031094 A1* | 2/2010 | Komagome ............ G11B 27/11 |
| | | 714/48 |
| 2012/0151299 A1 | 6/2012 | Suh |
| 2014/0316743 A1* | 10/2014 | Drees ..................... G05B 15/02 |
| | | 702/183 |
| 2017/0185499 A1 | 6/2017 | Lee et al. |
| 2017/0308447 A1 | 10/2017 | Wu |
| 2018/0173595 A1 | 6/2018 | Kim et al. |
| 2018/0182467 A1* | 6/2018 | Kang ..................... G11C 29/80 |
| 2019/0340018 A1 | 11/2019 | Koker et al. |
| 2019/0340080 A1 | 11/2019 | Milton et al. |
| 2020/0081757 A1 | 3/2020 | Ota et al. |
| 2020/0185052 A1* | 6/2020 | Nale ..................... G11C 11/406 |
| 2020/0194093 A1 | 6/2020 | Chen et al. |
| 2021/0064462 A1* | 3/2021 | Eun et al. |

FOREIGN PATENT DOCUMENTS

| | | |
|---|---|---|
| CN | 103514068 A | 1/2014 |
| CN | 107315690 A | 11/2017 |
| CN | 109086151 A | 12/2018 |
| CN | 106133842 B | 7/2019 |
| CN | 110598802 A | 12/2019 |
| CN | 111008091 A | 4/2020 |
| CN | 111312321 A | 6/2020 |
| WO | 2009126812 A1 | 10/2009 |
| WO | WO-2017131700 A1 * | 8/2017 ............. G11C 29/44 |

OTHER PUBLICATIONS

Extended European Search Report in European Appln No. 20940708.9, dated Jan. 9, 2023, 16 pages.

Cai et al., "Experimental Characterization, Optimization, and Recovery of Data Retention Errors in MLC NAND Flash Memory," arXiv preprint, arXiv:1805.02819v1, May 8, 2018, 11 pages.

EPO Communication pursuant to Rule 164(1) EPC issued in European Application No. 20940708.9 on Sep. 16, 2022, 17 pages.

* cited by examiner

MEMORY FAULT HANDLING METHOD AND APPARATUS, DEVICE, AND STORAGE MEDIUM

CROSS-REFERENCE TO RELATED APPLICATIONS

This application is a continuation of International Application No. PCT/CN2020/126112, filed on Nov. 3, 2020, which claims priority to Chinese Patent Application No. 202011179463.0, filed on Oct. 29, 2020 and Chinese Patent Application No. 202010569797.2, filed on Jun. 20, 2020. All of the aforementioned applications are hereby incorporated by reference in their entireties.

TECHNICAL FIELD

Embodiments of this application relate to the field of computer technologies, and in particular, to a memory fault handling method and apparatus, a device, and a storage medium.

BACKGROUND

A memory is an important part of a device. Generally, the memory includes a plurality of banks (also referred to as storage matrices), and each bank includes a plurality of memory rows. During use of the memory, faults often occur due to various reasons, and a proportion of memory faults caused by memory row faults is high. Therefore, recovery of the memory row faults can be used as an important means of fault recovery for the memory.

In the related art, each bank in the memory includes a redundant row. After cold reset of the device, that is, after breakdown and restart of the device or after a user manually restarts the device, the device performs memory self-check. If a memory fault in a memory row is detected, it is considered that a memory row fault occurs, and the faulty memory row is referred to as a faulty row. In this case, whether a quantity of memory faults of a correctable error (CE) type that occur in the faulty row and that are recorded in a fault log reaches a threshold may be determined. If the quantity reaches the threshold, it is determined that a condition for starting hard post package repair (hPPR) is currently satisfied, hPPR is started, and the faulty row is replaced with a redundant row in a bank in which the faulty row is located. In this way, fault recovery of the memory row is implemented.

However, in the related art, the hPPR can be started to replace the faulty row only after cold reset of the device. Therefore, there is adverse impact on services. If a memory fault is severe in a running process of the device and always cannot be recovered, the device breaks down, and services are severely affected.

SUMMARY

Embodiments of this application provide a memory fault handling method and apparatus, a device, and a storage medium, to perform memory fault recovery in time, prevent system breakdown, and reduce adverse impact on services. The technical solutions are as follows.

According to a first aspect, a memory fault handling method is provided, where the method includes:

starting fault analysis for a memory at a first moment, where the fault analysis includes: obtaining a current fault analysis result of the memory by analyzing historical fault information, where the historical fault information is fault information of the memory accumulated in a historical time period, and the historical time period is a time period before the first moment or a time period before the first moment and including the first moment; and starting fault recovery for the memory based on the current fault analysis result of the memory.

In this embodiment of this application, a fault analysis result is obtained by analyzing the historical fault information, and then memory fault recovery is performed based on the fault analysis result. In this solution, a memory fault can be analyzed more accurately, and memory fault recovery can be started without cold reset, thereby preventing system breakdown and reducing adverse impact on services.

Optionally, the first moment is a moment before a UCE fault occurs in a computer system. In other words, memory fault analysis is started in a running period of the computer system. The running period of the computer system is a period in which the computer system works normally.

Optionally, the first moment includes: a moment of periodic starting based on a preset condition; and/or a moment of determining that a memory fault occurs in the memory after the computer system runs.

In other words, when detecting that a memory fault occurs, the computer device starts analyzing the historical fault information to obtain a fault analysis result. Alternatively, the computer device periodically analyzes the historical fault information to obtain a fault analysis result. Alternatively, the computer device periodically analyzes the historical fault information to obtain a fault analysis result, and if it is detected that a memory fault occurs within a periodic interval, analyzes the historical fault information to obtain a fault analysis result, and restarts periodic analysis based on a time at which the memory fault is detected this time. Alternatively, the computer device periodically analyzes the historical fault information to obtain a fault analysis result, and if it is detected that a memory fault occurs within a periodic interval, analyzes the historical fault information to obtain a fault analysis result, but does not restart periodic analysis based on a time at which the memory fault is detected this time, that is, the periodic analysis is not affected.

It should be noted that the computer device periodically analyzes the historical fault information, to predict severity of the memory fault in time and recover the memory fault in time.

Optionally, in this embodiment of this application, a fault analysis model is used to analyze the historical fault information and determine the fault analysis result. In other words, the obtaining a current fault analysis result of the memory by the computer device by analyzing historical fault information includes: inputting the historical fault information into the fault analysis model to obtain the current fault analysis result of the memory, where the fault analysis model is an intelligent calculation analysis model.

It should be noted that analyzing the historical fault information by using the fault analysis model is only an implementation of analyzing the historical fault information according to this embodiment of this application. The computer device can also analyze the historical fault information in another implementation, for example, in a manner based on data statistics. This is not limited in this embodiment of this application. The following describes an implementation in which the computer device obtains the fault analysis result by using the fault analysis model or in another manner.

In this embodiment of this application, if the fault analysis result includes a fault mode, the starting fault recovery for the memory by the computer device based on the current fault analysis result of the memory includes: when the fault mode is a memory row fault, starting fault recovery for the memory, where the fault recovery includes: replacing a faulty row with a redundant row, and recovering data in the redundant row.

In this embodiment of this application, the obtaining a current fault analysis result of the memory by the computer device includes: obtaining a first statistical feature based on the historical fault information, where the first statistical feature indicates a quantity of faulty bits that occur in a first memory row in the historical time period, and the first memory row is any memory row; and when the first statistical feature is greater than a first threshold, determining that the fault mode is the memory row fault, where the first threshold indicates a quantity of faulty bits tolerable in each memory row.

Optionally, assuming that the computer device analyzes the historical fault information by using the fault analysis model, the fault analysis model includes the first threshold; and the computer device inputs the historical fault information into the fault analysis model, and obtains the first statistical feature by using the fault analysis model based on the historical fault information.

Optionally, if the fault analysis result further includes a fault level, the starting fault recovery for the memory by the computer device based on the current fault analysis result of the memory includes: when the fault mode is the memory row fault and the fault level is a high risk level, starting fault recovery for the memory.

Optionally, the obtaining a current fault analysis result of the memory by the computer device further includes: obtaining a second statistical feature and/or a third statistical feature based on the historical fault information, where the second statistical feature indicates a quantity of faults of each fault type that occur in the first memory row in the historical time period, and the third statistical feature indicates a quantity of error corrections that occur in the first memory row in the historical time period; and when the second statistical feature is greater than a second threshold, or when the third statistical feature is greater than a third threshold, or when the second statistical feature is greater than a second threshold and the third statistical feature is greater than a third threshold, determining that the fault level is the high risk level, where the second threshold indicates a quantity of faults of each fault type that are tolerable in each memory row, and the third threshold indicates a quantity of error corrections that are tolerable in each memory row.

Optionally, assuming that the computer device analyzes the historical fault information by using the fault analysis model, the fault analysis model further includes the second threshold and/or the third threshold. The computer device inputs the historical fault information into the fault analysis model, and obtains the second statistical feature and/or the third statistical feature by using the fault analysis model based on the historical fault information.

It should be noted that the historical fault information further includes a fault type and fault correction information of the memory fault that occurs in the historical time period. The fault type includes a CE type and a UCE type. Optionally, the CE type includes a patrol CE type, a read CE type, or the like. The fault correction information includes information such as an amount of error correction data (also called error correction data, in units of bits (bits)) for correcting each memory fault, and error correction code.

Optionally, a risk mode option is displayed on an interaction interface, where the risk mode option includes a memory high risk mode option and a memory low risk mode option. To be specific, the computer device provides an interaction interface, and a user may select a risk mode on the interaction interface.

Optionally, the first threshold, the second threshold, and the third threshold are variables that are set based on the risk mode.

Optionally, a first threshold of the memory high risk mode is less than a first threshold of the memory low risk mode; and/or a second threshold of the memory high risk mode is less than a second threshold of the memory low risk mode; and/or a third threshold of the memory high risk mode is less than a third threshold of the memory low risk mode.

Optionally, duration of the historical time period is a variable that is set based on the risk mode, and duration of a historical time period of the memory high risk mode is shorter than duration of a historical time period of the memory low risk mode.

It can be learned from the foregoing description that the user may flexibly select a risk mode based on a requirement. For example, if a service risk of the user is relatively high, the high risk mode may be selected. Therefore, the first threshold and/or the second threshold and/or the third threshold are/is relatively low, and/or the historical time period is relatively short. The computer device obtains the first statistical feature, the second statistical feature, and/or the third statistical feature by analyzing the historical fault information in the relatively short time period, and compares the obtained data with a relatively small threshold to analyze whether the fault is a memory row fault at the high risk level. In this way, the computer device can ensure timely identification of a less severe memory row fault. If the service risk of the user is relatively low, the low risk mode may be selected. In this way, a high identification rate can be ensured, that is, a relatively severe memory row fault can be identified in time.

In this embodiment of this application, the computer device provides the interaction interface for the user to select a risk mode. The computer device determines, based on the risk mode selected by the user, a time window of fault information that needs to be analyzed and/or a threshold value during threshold comparison, performs threshold comparison by collecting statistics of fault information within the corresponding duration, and when identifying that the fault mode is the memory row fault, recovers the memory fault in time. In this way, the risk mode selected by the user is integrated with a threshold comparison method, and calculation pressure of the computer device is reduced while the memory row fault is accurately predicted.

In this embodiment of this application, it can be learned from the foregoing description that if the fault analysis result includes a fault mode, the starting fault recovery for the memory by the computer device based on the current fault analysis result of the memory includes: when the fault mode is a memory row fault, starting fault recovery for the memory, where the fault recovery includes: replacing a faulty row with a redundant row, and recovering data in the redundant row. In other words, when determining that the fault mode is the memory row fault, the computer device replaces the faulty row with the redundant row in the memory, and recovers the faulty data.

Alternatively, it can be learned from the foregoing description that if the fault analysis result further includes a fault level, the starting fault recovery for the memory by the computer device based on the current fault analysis result of the memory includes: when the fault mode is the memory row fault and the fault level is a high risk level, starting fault recovery for the memory. In other words, when determining that the fault mode is the memory row fault and that the fault level is the high risk level, the computer device replaces the faulty row with the redundant row in the memory, and recovers the faulty data.

Optionally, the redundant row and the faulty row are located in a same bank in the memory. In other words, the computer device replaces the faulty row with the redundant row in the bank in which the faulty row is located.

Optionally, the recovering data in the redundant row by the computer device includes: performing a read operation on the redundant row; and if the data read from the redundant row is erroneous data, correcting the erroneous data, and writing back the corrected data to the redundant row, to implement recovery of the data in the redundant row. In other words, in this embodiment of this application, the faulty data is recovered by performing the read operation and data write-back on the redundant row.

Optionally, the performing a read operation on the redundant row; and if the data read from the redundant row is erroneous data, correcting the erroneous data, and writing back the corrected data to the redundant row includes: dividing the redundant row into M segments, where each segment includes one or more storage units, and M is an integer greater than 1; assuming i=1, performing a read operation on an $i^{th}$ segment in the redundant row; if data read from the $i^{th}$ segment in the redundant row is erroneous data, correcting the erroneous data, and writing back the corrected data to the $i^{th}$ segment; and if i is not equal to M, assuming i=i+1, returning to perform a read operation on the $i^{th}$ segment in the redundant row until i is equal to M. In other words, the computer device recovers the data in the redundant row by means of sequential segment-by-segment reading, correction, and write-back.

Optionally, after the data read from the redundant row is erroneous data, the method further includes: generating a correctable error (CE); and suppressing the CE.

In this embodiment of this application, after the data read from the redundant row is erroneous data, a CE is generated in the computer device, and the computer device suppresses the CE. To be specific, because the computer device detects erroneous data when reading the data from the redundant row, the computer device considers that a CE is detected. Because the CE is not caused by a memory fault of the computer reports breakdown and restart, the CE needs to be suppressed, that is, the CE is not handled, or the computer device does not record the CE.

Optionally, after recovery of the data in the redundant row is completed, the method further includes: releasing the suppression operation on the CE.

However, the CE generated after the redundant row is recovered by the computer device is caused by a real memory fault. Therefore, the CE needs to be handled, that is, the suppression operation on the CE is released, and the CE is recorded.

As described above, after a fault analysis result is obtained by analyzing fault information of the first memory row in the historical time period, an implementation of starting fault recovery for the memory by the computer device is: when the fault mode is a memory row fault, or when the fault mode is a memory row fault and the fault level is a high risk level, starting fault recovery for the memory, where the fault recovery is: replacing a faulty row with a redundant row and recovering data in the redundant row. In other embodiments, the computer device obtains a fault analysis result by analyzing fault information of a second bank in the historical time period. Correspondingly, an implementation of starting fault recovery for the memory by the computer device is: when the fault mode is a memory bank fault, or when the fault mode is a memory bank fault and the fault level is a high risk level, starting fault recovery for the memory, where the fault recovery is: replacing a faulty bank with a redundant bank, and recovering data in the redundant bank.

In other words, if the fault analysis result includes a fault mode, the starting fault recovery for the memory by the computer device based on the current fault analysis result of the memory includes: when the fault mode is a memory bank fault, starting fault recovery for the memory, where the fault recovery includes: replacing a faulty bank with a redundant bank, and recovering data in the redundant bank.

Alternatively, if the fault analysis result includes a fault mode and a fault level, the starting fault recovery for the memory by the computer device based on the current fault analysis result of the memory includes: when the fault mode is a memory bank fault and the fault level is a high risk level, starting fault recovery for the memory, where the fault recovery includes: replacing a faulty bank with a redundant bank, and recovering data in the redundant bank.

Optionally, the redundant bank and the faulty bank are located on a same channel in the memory.

It should be noted that a difference between this embodiment and the foregoing embodiment is as follows: The second bank in this embodiment and the first memory row in the foregoing embodiment are concepts at a same level. In the foregoing embodiment, the historical fault information is analyzed at a granularity of a memory row to obtain the fault analysis result, but in this embodiment, the historical fault information is analyzed at a granularity of a bank to obtain the fault analysis result. In the foregoing embodiment, the faulty row is replaced with the redundant row, and the redundant row and the faulty row are in the same bank, but in this embodiment, the faulty bank is replaced with the redundant bank, and the redundant bank and the faulty bank are on the same channel in the memory.

According to a second aspect, a memory fault handling apparatus is provided, where the memory fault handling apparatus has a function for implementing behavior of the memory fault handling method in the first aspect. The memory fault handling apparatus includes one or more modules, and the one or more modules are configured to implement the memory fault handling method provided in the first aspect.

In other words, a memory fault handling apparatus is provided, where the apparatus includes:

an analysis module, configured to start fault analysis for a memory at a first moment, where the fault analysis includes: obtaining a current fault analysis result of the memory by analyzing historical fault information, where the historical fault information is fault information of the memory accumulated in a historical time period, and the historical time period is a time period before the first moment or a time period before the first moment and including the first moment; and a handling module, configured to start fault recovery for the memory based on the current fault analysis result of the memory.

Optionally, the first moment is a moment before an uncorrectable error (UCE) fault occurs in a computer system.

Optionally, the first moment includes:

a moment of periodic starting based on a preset condition; and/or a moment of determining that a memory fault occurs in the memory after the computer system runs.

Optionally, the analysis module includes:

an analysis submodule, configured to input the historical fault information into a fault analysis model to obtain the current fault analysis result of the memory, where the fault analysis model is an intelligent calculation analysis model.

Optionally, if the fault analysis result includes a fault mode, the handling module includes:

a first recovery submodule, configured to start fault recovery for the memory when the fault mode is a memory row fault, where the fault recovery includes: replacing a faulty row with a redundant row, and recovering data in the redundant row.

Optionally, the analysis module is specifically configured to:

obtain a first statistical feature based on the historical fault information, where the first statistical feature indicates a quantity of faulty bits that occur in a first memory row in the historical time period, and the first memory row is any memory row; and when the first statistical feature is greater than a first threshold, determine that the fault mode is the memory row fault, where the first threshold indicates a quantity of faulty bits tolerable in each memory row.

Optionally, if the fault analysis result further includes a fault level, the handling module includes:

a second recovery submodule, configured to start fault recovery for the memory when the fault mode is the memory row fault and the fault level is a high risk level.

Optionally, the analysis module is further specifically configured to:

obtain a second statistical feature and/or a third statistical feature based on the historical fault information, where the second statistical feature indicates a quantity of faults of each fault type that occur in the first memory row in the historical time period, and the third statistical feature indicates a quantity of error corrections that occur in the first memory row in the historical time period; and when the second statistical feature is greater than a second threshold, or when the third statistical feature is greater than a third threshold, or when the second statistical feature is greater than a second threshold and the third statistical feature is greater than a third threshold, determine that the fault level is the high risk level, where the second threshold indicates a quantity of faults of each fault type that are tolerable in each memory row, and the third threshold indicates a quantity of error corrections that are tolerable in each memory row.

Optionally, the apparatus further includes:

an interaction module, configured to display a risk mode option on an interaction interface, where the risk mode option includes a memory high risk mode option and a memory low risk mode option.

Optionally, the first threshold, the second threshold, and the third threshold are variables that are set based on the risk mode.

Optionally, the first recovery submodule is specifically configured to:

perform a read operation on the redundant row; and if the data read from the redundant row is erroneous data, correct the erroneous data, and write back the corrected data to the redundant row, to implement recovery of the data in the redundant row.

Optionally, the apparatus further includes:

a generation module, configured to generate a correctable error (CE) after the data read from the redundant row is erroneous data; and a suppression module, configured to suppress the CE.

Optionally, the apparatus further includes:

a releasing module, configured to release the suppression operation on the CE after recovery of the data in the redundant row is completed.

Optionally, if the fault analysis result includes a fault mode, the handling module includes:

a third recovery submodule, configured to start fault recovery for the memory when the fault mode is a memory bank fault, where the fault recovery includes: replacing a faulty bank with a redundant bank, and recovering data in the redundant bank.

Optionally, the redundant bank and the faulty bank are located on a same channel in the memory.

According to a third aspect, a computer device is provided, where the computer device stores a computer program, and when the computer program is run by the computer device, the memory fault handling method provided in the first aspect is implemented.

Optionally, the computer device includes a processor and a memory, where the memory is configured to store a program for performing the memory fault handling method provided in the first aspect, and store data used for implementing the memory fault handling method provided in the first aspect. The processor is configured to execute the program stored in the memory to implement the memory fault handling method provided in the first aspect. The computer device of the storage device may further include a communications bus, and the communications bus is configured to establish a connection between the processor and the memory.

According to a fourth aspect, a computer-readable storage medium is provided, where the computer-readable storage medium stores instructions, and when the instructions are run on a computer, the computer is enabled to perform the memory fault handling method provided in the first aspect.

According to a fifth aspect, a computer program product including instructions is provided, where when the instructions are run on a computer, the computer is enabled to perform the memory fault handling method according to the first aspect.

Technical effects achieved in the second aspect, the third aspect, the fourth aspect, and the fifth aspect are similar to technical effects achieved by the corresponding technical means in the first aspect, and details are not described herein again.

The technical solutions provided in the embodiments of this application can bring at least the following beneficial effects:

In the embodiments of this application, a fault analysis result is obtained by analyzing historical fault information, and then memory fault recovery is performed based on the fault analysis result. In the solutions, a memory fault can be analyzed more accurately. In addition, in the solutions, memory fault recovery can be started without cold reset, and the memory fault can be recovered in time, thereby preventing system breakdown and reducing adverse impact on services.

DESCRIPTION OF EMBODIMENTS

To make the objectives, technical solutions, and advantages of this application clearer, the following further describes the implementations of the embodiments of this application in detail with reference to the accompanying drawings.

Figure 1:
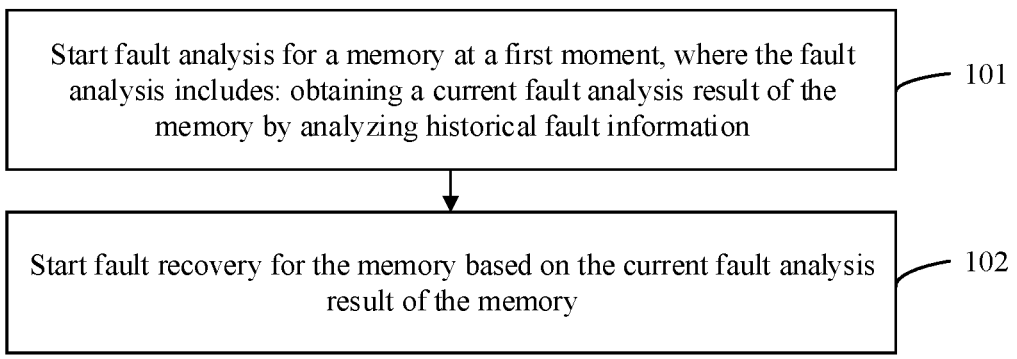
FIG. 1 is a flowchart of a memory fault handling method according to an embodiment of this application.

FIG. 1 is a flowchart of a memory fault handling method according to an embodiment of this application. The method is applied to a computer device. Referring to FIG. 1, the method includes the following steps.

Step 101: Start fault analysis for a memory at a first moment, where the fault analysis includes: obtaining a current fault analysis result of the memory by analyzing historical fault information.

In this embodiment of this application, a basic storage unit of the memory (such as a dynamic random access memory (DRAM) usually includes a transistor and a capacitor. A quantity of electrical charges carried on the capacitor determines whether the basic storage unit is '0' or '1'. Ionizing particles of an external environment or semiconductor hardware defects of the internal transistor may cause an error in the memory, that is, a memory fault.

After the memory fault occurs, the memory itself has an error correction algorithm (for example, error checking and correcting (ECC)) to correct the error. A correctable error is referred to as a correctable error (CE). The error correction algorithm has an error correction capability, but the capability is limited. If the error correction capability of the error correction algorithm is exceeded, an uncorrectable error (UCE) is generated, causing device breakdown.

In this embodiment of this application, to recover a memory fault in time, reduce UCE generation, reduce device breakdown and restart, and reduce adverse impact on services, the computer device obtains a fault analysis result by analyzing fault information of a memory fault that occurs in a historical time period, and then the computer device determines, based on the fault analysis result, whether to handle the memory fault and how to handle the memory fault.

In this embodiment of this application, the computer device starts fault analysis for the memory at the first moment, where the fault analysis includes: obtaining the current fault analysis result of the memory by analyzing the historical fault information, where the historical fault information is fault information of the memory accumulated in the historical time period, and the historical time period is a time period before the first moment or a time period before the first moment and including the first moment.

Optionally, the first moment is a moment before a UCE fault occurs in a computer system. In other words, memory fault analysis is started in a running period of the computer system. The running period of the computer system is a period in which the computer system works normally.

Optionally, the first moment includes: a moment of periodic starting based on a preset condition; and/or a moment of determining that a memory fault occurs in the memory after the computer system runs.

In other words, when detecting that a memory fault occurs, the computer device starts analyzing the historical fault information to obtain a fault analysis result. Alternatively, the computer device periodically analyzes the historical fault information to obtain a fault analysis result. Alternatively, the computer device periodically analyzes the historical fault information to obtain a fault analysis result, and if it is detected that a memory fault occurs within a periodic interval, analyzes the historical fault information to obtain a fault analysis result, and restarts periodic analysis based on a time at which the memory fault is detected this time. Alternatively, the computer device periodically analyzes the historical fault information to obtain a fault analysis result, and if it is detected that a memory fault occurs within a periodic interval, analyzes the historical fault information to obtain a fault analysis result, but does not restart periodic analysis based on a time at which the memory fault is detected this time, that is, the periodic analysis is not affected.

It should be noted that the computer device periodically analyzes the historical fault information, to predict severity of the memory fault in time and recover the memory fault in time.

Optionally, in this embodiment of this application, a fault analysis model is used to intelligently analyze the historical fault information and obtain the fault analysis result. In other words, the computer device inputs the historical fault information into the fault analysis model to obtain the current fault analysis result of the memory, where the fault analysis model is an intelligent calculation analysis model.

It should be noted that analyzing the historical fault information by using the fault analysis model is only an implementation of analyzing the historical fault information according to this embodiment of this application. The computer device can also analyze the historical fault information in another implementation, for example, in a manner based on data statistics. The used analysis method is not limited in this embodiment of this application. The following describes an implementation in which the computer device obtains the fault analysis result by using the fault analysis model or in another manner.

In this embodiment of this application, if the fault analysis result includes a fault mode, when the fault mode is a memory row fault, the computer device starts fault recovery for the memory, where the fault recovery includes: replacing a faulty row with a redundant row, and recovering data in the redundant row. In other words, when the computer device determines, by analyzing the historical fault information, that the current fault mode of the memory is the memory row fault, the computer device performs a memory row replacement and data recovery.

In this embodiment of this application, the historical fault information includes a fault location and fault time of the memory fault that occurs in the historical time period. The computer device collects statistics of the fault location and the fault time included in the historical fault information, to analyze the memory fault information and determine the fault mode.

The fault location is a physical address at which the memory fault occurs. It should be noted that each memory fault that occurs is located in a cell. When it is detected that a memory fault occurs in a cell, a fault location of the current memory fault is a memory row of a bank or a row and column of a bank in which the cell is located. The fault time is the time when the memory fault occurs.

It should be noted that the computer device stores a memory fault log, and that the memory fault log records the fault information of the memory fault that occurs in the historical time period, that is, stores the historical fault information.

In this embodiment of this application, the obtaining a current fault analysis result of the memory by the computer device includes: obtaining a first statistical feature based on the historical fault information, where the first statistical feature indicates a quantity of faulty bits that occur in a first memory row in the historical time period, and the first memory row is any memory row; and when the first statistical feature is greater than a first threshold, determining that the fault mode is the memory row fault, where the first threshold indicates a quantity of faulty bits tolerable in each memory row.

Optionally, assuming that the computer device analyzes the historical fault information by using the fault analysis model, the fault analysis model includes the first threshold, and the computer device inputs the historical fault information into the fault analysis model, and obtains the first statistical feature by using the fault analysis model based on the historical fault information. In other words, by using the fault analysis model, the computer device counts the quantity of faulty bits that occur in the first memory row in the historical time period, to obtain the first statistical feature, and determines the fault mode through threshold determining.

It should be noted that the memory includes a plurality of banks, where each bank includes a plurality of memory rows, each memory row includes a plurality of cells, and a memory cell in which a memory fault occurs is a faulty bit. In the historical time period, no memory fault may occur, or one memory fault may occur, or more than one memory fault occurs in a cell. The historical fault information includes a fault time and a fault location of each memory fault in the historical time period. The computer device counts a quantity of memory faults whose fault locations are different in the memory faults of the first memory row in the historical time period, to obtain the first statistical feature. If the first statistical feature is greater than the first threshold, it indicates that a memory fault has occurred in a plurality of cells in the first memory row. In this case, the computer device determines that the current fault mode of the memory is the memory row fault.

In addition, it can be learned from the foregoing description that the computer device periodically starts memory fault analysis, or starts memory fault analysis when a memory fault occurs. Based on this, there are a plurality of cases in which the computer device determines the first memory row whose statistics need to be collected. The cases are described hereinafter.

When detecting that a memory fault occurs and the memory fault analysis is started, the computer device determines the first memory row based on the fault location of the current memory fault, where the first memory row is a memory row in which the current memory fault is located. Alternatively, the computer device determines a first bank based on the fault location of the current memory fault, and determines one memory row included in the first bank as the first memory row, where the first bank is a bank in which the current memory fault is located, and the first memory row is one of memory rows included in the first bank. Alternatively, the computer device determines one memory row included in the memory as the first memory row, that is, the first memory row is one of memory rows included in the memory.

When the computer device periodically starts memory fault analysis, the computer device determines the first memory row based on a fault location of a recent memory fault, where the first memory row is a memory row in which the recent memory fault is located. Alternatively, the computer device determines a first bank based on a fault location of a recent memory fault, and determines a memory row included in the first bank as the first memory row, where the first bank is a bank in which the recent memory fault is located, and the first memory row is one of memory rows included in the first bank. Alternatively, the computer device determines one memory row included in the memory as the first memory row, that is, the first memory row is one of memory rows included in the memory.

It should be noted that, when the first memory row is one of the memory rows included in the first bank or the memory, the computer device also collects statistics of other memory rows in the first bank or the memory than the first memory row in a manner same as the manner of collecting statistics of the first memory row, obtains data corresponding to each of the other memory rows by collecting statistics, and determines the first statistical feature based on the data obtained by collecting statistics.

When the first memory row is a memory row in which the current or recent memory fault occurs, the computer device collects statistics of fault information of the first memory row in the historical fault information to obtain a quantity, and directly uses the quantity obtained by collecting statistics as the first statistical feature, that is, obtains the first statistical feature. When the first memory row is one of the memory rows included in the first bank or the memory, the computer device collects statistics of fault information of a plurality of first memory rows in the historical fault information to obtain a plurality of quantities, where each quantity corresponds to one memory row; and the computer device uses a maximum value of the plurality of quantities obtained by collecting statistics as the first statistical feature, or uses each of the plurality of quantities as one first statistical feature, to obtain a plurality of first statistical features, where each first statistical feature corresponds to one memory row.

In this embodiment of this application, after obtaining the first statistical feature, the computer device compares the first statistical feature with the first threshold, to determine the current fault mode of the memory. For example, when one first statistical feature is obtained, and the first statistical feature is greater than the first threshold, it is determined that the memory mode is the memory row fault. When a plurality of first statistical features are obtained, and at least one first statistical feature in the plurality of first statistical features is greater than the first threshold, it is determined that the memory mode is the memory row fault.

Optionally, if the fault analysis result further includes a fault level, when the fault mode is the memory row fault and the fault level is a high risk level, the computer device starts fault recovery for the memory. The following describes an implementation in which the computer device determines the current fault level of the memory by analyzing the historical fault information.

In this embodiment of this application, the obtaining a current fault analysis result of the memory by the computer device further includes: obtaining a second statistical feature and/or a third statistical feature based on the historical fault information, where the second statistical feature indicates a quantity of faults of each fault type that occur in the first memory row in the historical time period, and the third statistical feature indicates a quantity of error corrections that occur in the first memory row in the historical time period; and when the second statistical feature is greater than a second threshold, or when the third statistical feature is greater than a third threshold, or when the second statistical feature is greater than a second threshold and the third statistical feature is greater than a third threshold, determining that the fault level is the high risk level, where the second threshold indicates a quantity of faults of each fault type that are tolerable in each memory row, and the third threshold indicates a quantity of error corrections that are tolerable in each memory row.

Optionally, assuming that the computer device analyzes the historical fault information by using the fault analysis model, the fault analysis model further includes the second threshold and/or the third threshold. The computer device inputs the historical fault information into the fault analysis model, and obtains the second statistical feature and/or the third statistical feature by using the fault analysis model based on the historical fault information. In other words, by using the fault analysis model, the computer device counts the quantity of faults of each type that occur in the first memory row in the historical time period, to obtain the second statistical feature, and/or counts the quantity of error corrections that occur in the first memory row in the historical time period, to obtain the third statistical feature. Then by using the fault analysis model, the computer device compares the second statistical feature with the second threshold and/or compares the third statistical feature with the third threshold, to determine the fault level.

It should be noted that the historical fault information further includes a fault type and fault correction information of the memory fault that occurs in the historical time period. The fault type includes a CE type and a UCE type. Optionally, the CE type includes a patrol CE type, a read CE type, or the like. The fault correction information includes information such as an amount of error correction data (also called error correction data, in units of bits (bits)) for correcting (such as ECC error correction) the memory fault that is sent each time, and error correction code.

In this embodiment of this application, it can be learned from the foregoing description that the computer device periodically starts memory fault analysis, or starts memory fault analysis when a memory fault occurs. Based on this, there are a plurality of implementations in which the computer device collects statistics of the fault information of the first memory row in the historical time period to obtain the second statistical feature and/or the third statistical feature. In other words, there are a plurality of cases in which the computer device determines the first memory row whose statistics need to be collected, and the cases are the same as the plurality of cases in which the first memory row is determined in the foregoing process of obtaining the first statistical feature by collecting statistics. Refer to the foregoing description. Details are not described herein again.

When the first memory row is a memory row in which the current or recent memory fault occurs, the computer device obtains, by collecting statistics, data corresponding to one memory row, and directly uses the data obtained by collecting statistics as the second statistical feature and/or the third statistical feature. When the first memory row is one of the memory rows included in the first bank or the memory, the computer device obtains, by collecting statistics, data corresponding to the plurality of memory rows, and the computer device uses the data obtained by collecting statistics as the second statistical feature and/or the third statistical feature corresponding to the corresponding memory rows.

In this embodiment of this application, after obtaining the second statistical feature and/or the third statistical feature, the computer device compares the second statistical feature with the second threshold, and/or compares the third statistical feature with the third threshold, to determine the current fault level of the memory.

It should be noted that because there are a plurality of fault types, and there may be one or more fault types in the historical fault information, the computer device needs to count a quantity of faults of one or more fault types that occur in the first memory row, to obtain one or more second statistical features corresponding to the memory row, where each second statistical feature corresponds to one fault type.

Optionally, the computer device stores one or more second thresholds. For example, the fault analysis model includes one second threshold or a plurality of second thresholds.

When the computer device stores one second threshold, the computer device compares each of obtained one or more second statistical features corresponding to each memory row with the second threshold, and when all or a part of the one or more second statistical features are greater than the second threshold, determines that the fault level is the high risk level.

When the computer device stores a plurality of second thresholds, each of the plurality of second thresholds corresponds to one fault type. For one or more obtained second statistical features corresponding to each memory row, the computer device compares each second statistical feature with a second threshold corresponding to a same fault type; and when all or a part of the one or more second statistical features are greater than a corresponding second threshold, determines that the fault level is the high risk level.

For example, the fault types include a patrol CE type, a read CE type, and a UCE type. Memory faults that occur in the first memory row in the historical time period include three faults of the patrol CE type and one fault of the read CE type. In this case, the computer device collects statistics of the first memory row to obtain two second statistical features that are respectively 3 and 1, where 3 corresponds to the patrol CE type, and 1 corresponds to the read CE type. Assuming that the computer device stores one second threshold, and that the second threshold is 5, the computer device compares both 3 and 1 with 5, and determines that the fault level is a low risk level. Assuming that the computer device stores three second thresholds, which are respectively 8, 5, and 2, where 8 corresponds to the patrol CE type, 5 corresponds to the read CE type, and 2 corresponds to the UCE type, the computer device compares 3 with 8, compares 1 with 5, and determines that the fault level is a low risk level.

It should be noted that when the first memory row is a memory row in which the current or recent memory fault occurs, because data corresponding to only one memory row is collected, when the second statistical feature corresponding to the memory row is greater than the second threshold, and/or when the third statistical feature is greater than the third threshold, it is determined that the fault level is the high risk level. If the fault information of the memory row is analyzed according to the foregoing method, and it is determined that the current fault mode of the memory is the memory row fault, it is determined that the memory row is a faulty row, and fault recovery needs to be started for the memory.

However, when the first memory row is one of the memory rows included in the first bank or the memory, because data corresponding to a plurality of memory rows is collected, when the first statistical feature corresponding to a same memory row is greater than the first threshold, and the corresponding second statistical feature is greater than the second threshold and/or the third statistical feature is greater than the third threshold, it is determined that the memory row is a faulty row, and fault recovery needs to be started for the memory.

Optionally, a risk mode option is displayed on an interaction interface, where the risk mode option includes a memory high risk mode option and a memory low risk mode option. To be specific, the computer device provides an interaction interface, and a user may select a risk mode on the interaction interface.

Optionally, the first threshold, the second threshold, and the third threshold are variables that are set based on the risk mode.

Optionally, a first threshold of the memory high risk mode is less than a first threshold of the memory low risk mode; and/or a second threshold of the memory high risk mode is less than a second threshold of the memory low risk mode; and/or a third threshold of the memory high risk mode is less than a third threshold of the memory low risk mode.

Optionally, duration of the historical time period is a fixed parameter that is set. For example, the historical time period is a time period from installation and running of the computer device to current analysis of the fault information, or the user configures duration of the historical time period by using the computer device, for example, sets the duration of the historical time period to one month, where the historical time period is one month before the current analysis of the fault information.

Optionally, the duration of the historical time period is a variable that is set based on the risk mode, and duration of a historical time period of the memory high risk mode is shorter than duration of a historical time period of the memory low risk mode.

Optionally, when the computer device determines through analysis that the fault mode is the memory row fault, or when the computer device determines through analysis that the fault mode is the memory row fault and that the fault level is the high risk level, the computer device prompts, by using the interaction interface, that a memory fault risk exists.

Optionally, the user may further modify one or more of the first threshold, the second threshold, the third threshold, and the duration of the historical time period on the interaction interface.

It can be learned from the foregoing description that the user may flexibly select a risk mode based on a requirement. For example, if a service risk of the user is relatively high, the high risk mode may be selected. Therefore, the first threshold and/or the second threshold and/or the third threshold are/is relatively low, and/or the historical time period is relatively short. The computer device obtains the first statistical feature, the second statistical feature, and/or the third statistical feature by analyzing the historical fault information in the relatively short time period, and compares the obtained data with a relatively small threshold to analyze whether the fault is a memory row fault at the high risk level. In this way, the computer device can ensure timely identification of a less severe memory row fault. If the service risk of the user is relatively low, the low risk mode may be selected. In this way, high identification can be ensured, that is, a relatively severe memory row fault can be identified in time.

In this embodiment of this application, the computer device provides the interaction interface for the user to select a risk mode. The computer device determines, based on the risk mode selected by the user, duration of fault information that needs to be analyzed and/or a threshold value during threshold determining, performs threshold comparison by collecting statistics of fault information within the corresponding duration, and when identifying that the fault mode is the memory row fault, or when identifying that the fault mode is the memory row fault and that the fault level is the high risk level, recovers the memory fault in time. In this way, the risk mode selected by the user is integrated with a threshold comparison method, and calculation pressure of the computer device is reduced while the memory row fault is accurately predicted.

Optionally, in other embodiments, for the second statistical feature and the third statistical feature, the computer device collects data in a statistical manner at a finer granularity. For example, the computer device counts at least one of a maximum quantity and an average quantity of memory faults of each fault type that occur in the first memory row within a first time interval, to obtain the second statistical feature, and counts at least one of a maximum amount of error correction data and an average amount of error correction data of the memory faults of each fault type in the first memory row within the first time interval, to obtain the third statistical feature, where the historical time period includes a plurality of time intervals, and the first time interval is one of the plurality of time intervals.

The computer device determines the fault level (risk level or risk level) based on the maximum quantity and/or the average quantity, and the maximum amount of error correction data and/or the average amount of error correction data. For example, when the computer device determines the maximum quantity and the maximum amount of error correction data, and the maximum quantity is greater than or equal to the second threshold, and/or the maximum amount of error correction data is greater than or equal to the third threshold, the computer device determines that the fault level is the high risk level, where fault levels are classified into the low risk level and the high risk level. Alternatively, the computer device determines the fault level based on the threshold. Optionally, the fault levels are classified into a plurality of levels, for example, a level 1, a level 2, and a level 3. The level 1 indicates that a relatively severe memory risk exists, and the level 3 indicates that a less severe memory risk exists.

It should be noted that in this embodiment, the average quantity includes one or more of an arithmetic average value, a geometric average value, and a harmonic average value. In addition to counting the maximum quantity and/or the average quantity, and the maximum amount of error correction data and/or the average amount of error correction data, statistics of other data may be collected, for example, a median and a standard deviation of various types of data. In other words, there are a plurality of statistical manners. In this embodiment of this application, only counting the maximum quantity, the average quantity, the maximum amount of error correction data, and the average amount of error correction data is used as an example for description.

Optionally, when the computer device can further determine the fault level, the computer device stores a first fault level, and when the computer device identifies the memory row fault, and the identified fault level is the same as the first fault level or exceeds the first fault level, the computer device automatically recovers the memory row fault. Alternatively, the computer device first displays, by using the interaction interface, that a relatively severe memory fault currently exists, to prompt the user to select whether to perform memory fault recovery, and the computer device determines, based on the selection operation of the user, whether to recover the memory row fault.

Optionally, the first fault level stored in the computer device is a default configuration. Alternatively, the first fault level is a fault level selected by the user, that is, the user selects a fault level in advance based on a service risk requirement by using the interaction interface provided by the computer device.

In this embodiment, the computer device obtains a fine-granularity statistical feature each time, to identify a fault mode and a fault level and predict a memory row fault and a risk grade more accurately.

Optionally, in other embodiments, an implementation in which the computer device analyzes the historical fault information and determines the fault mode and the fault level may also be as follows: The computer device determines the fault mode in a manner of threshold determining by collecting data, and determines the fault level based on intelligent analysis by using the fault analysis model. In this implementation, the computer device collects statistics of the fault time, the fault location, and the like in the historical fault information, identifies a faulty row mode through threshold comparison, and intelligently analyzes the fault location, the fault time, the fault type, and fault error correction information in the historical fault information by using the fault analysis model, to identify the fault level. Optionally, in this implementation, the computer device provides the interaction interface for the user to select and configure the duration of the historical time period, the first threshold, the first fault level, and the like, and the computer device accurately predicts the memory row fault and the fault level based on the configuration selected by the user.

Step 102: Start fault recovery for the memory based on the current fault analysis result of the memory.

In this embodiment of this application, when the fault analysis result includes the fault mode, and the current fault mode of the memory is the memory row fault, the computer device starts fault recovery for the memory. Optionally, the fault analysis result further includes the fault level, and when the fault mode is the memory row fault and the fault level is the high risk level, fault recovery is started for the memory.

In this embodiment of this application, the fault recovery includes: replacing the faulty row with the redundant row in the memory, and recovering the data in the redundant row.

The faulty row is a memory row in which the memory row fault occurs. For example, when the first memory row is a memory row in which the current (or recent) memory fault is located, the faulty row is the first memory row. When the first memory row is one of memory rows included in the first bank (or the memory), the computer device can determine the faulty row in a manner of threshold determining or intelligent analysis, where the faulty row is a memory row in the first bank (or the memory).

In this embodiment of this application, the redundant row and the faulty row are located in a same bank in the memory, and the computer device replaces the faulty row with the redundant row in the bank in which the faulty row is located.

Optionally, after determining that fault recovery needs to be started for the memory, the computer device further generates a row fault isolation request, and after generating the row fault isolation request, replaces the faulty row with the redundant row in the memory.

It can be learned from the foregoing description that the user may select a risk mode based on the service risk requirement. In this way, after the computer device determines, based on the risk mode selected by the user, that the fault mode is the memory row fault, the computer device generates the row fault isolation request, indicating that a condition for handling the memory row fault is currently satisfied, and the computer device performs the memory row replacement. Optionally, the computer device may further prompt the user to select memory row fault recovery. After receiving a memory row fault recovery instruction from the user, the computer device replaces the faulty row of the memory.

Optionally, in this embodiment of this application, a technology for performing an online memory faulty row replacement includes a soft post package repair (sPPR) technology.

In this embodiment of this application, an implementation of recovering the data in the redundant row by the computer device is: performing a read operation on the redundant row; and if the data read from the redundant row is erroneous data, correcting the erroneous data, and writing back the corrected data to the redundant row, to implement recovery of the data in the redundant row. In other words, in this embodiment of this application, the faulty data is recovered by performing the read operation and data write-back on the redundant row.

It should be noted that the computer device reads, by triggering the read operation on the redundant row, all data on a memory chip (chip) in which the redundant row is located, and when reading the redundant row, determines, based on other data read from the memory chip, whether the data in the redundant row is erroneous data, and corrects the erroneous data based on the read other data. In other embodiments, the computer device triggers the read operation on the redundant row, reads data in the bank in which the redundant row is located and some other banks included in the memory, and performs a data error correction on the redundant row based on the read data. In other words, banks or memory chips from which the computer device actually reads data to perform the data error correction on the redundant row is related to a storage algorithm (such as memory interleaving) used when the data is actually stored in the memory, banks to which a chip select signal of a memory read operation is connected, and the like.

In this embodiment of this application, the memory read operation is performed in a segment-by-segment read manner, and a read interval of the memory read operation is configured in the computer device by default. For example, the read interval is four bits, that is, 4-bit data is read each time, or the read interval is one or two cells, that is, data of one or two cells is read each time. The user can also change the default configuration.

For example, the read interval is four bits, and for data in the redundant row, assuming that the data in the redundant row is 100 bits, the computer device reads 4-bit data in sequence each time and performs recovery, and after the recovery, reads next 4-bit data for recovery, until all the data in the redundant row is recovered.

Optionally, the computer device divides the redundant row into M segments, where each segment includes one or more storage units, and M is an integer greater than 1. Assuming i=1, the computer device performs a read operation on an $i^{th}$ segment in the redundant row; if data read from the $i^{th}$ segment in the redundant row is erroneous data, corrects the erroneous data, and writes back the corrected data to the $i^{th}$ segment; and if i is not equal to M, assuming i=i+1, returns to perform a read operation on the $i^{th}$ segment in the redundant row until i is equal to M.

For example, the computer device reads 4-bit data each time for an error correction, performs the error correction on the read 4-bit data by using the error correction algorithm, and writes back the corrected data to a position in which the 4-bit data is located.

It should be noted that in the process of performing the read operation on the redundant row, the computer device performs the error correction on the data in the redundant row by using the error correction algorithm (for example, ECC or single device data error correction (SDDC)).

Figure 2:
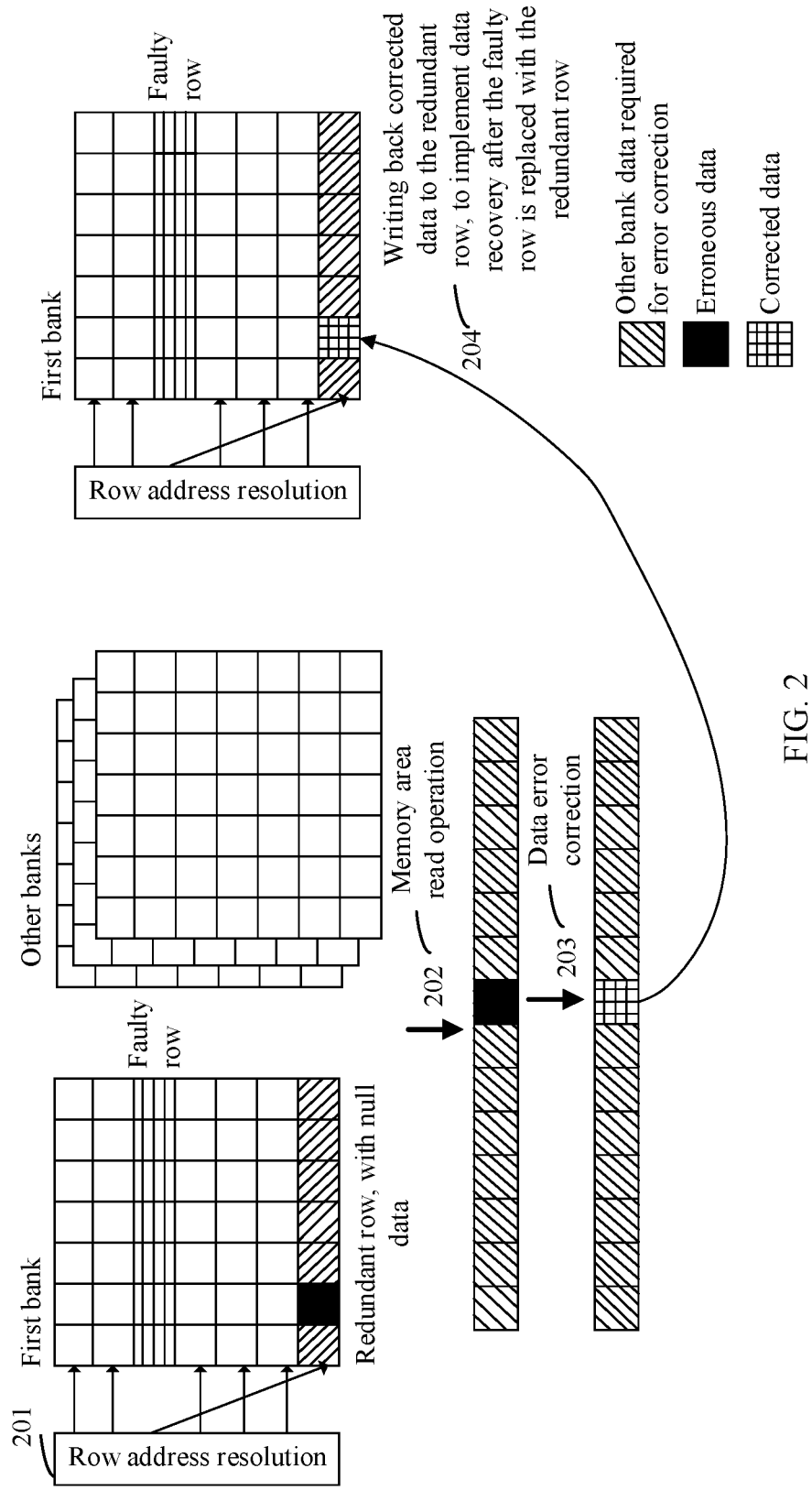
FIG. 2 is a schematic diagram for performing data recovery on a redundant row according to an embodiment of this application.

FIG. 2 is a schematic diagram for performing data recovery on a redundant row according to an embodiment of this application. Referring to FIG. 2, the method includes the following steps.

Step 201: A computer device performs row address resolution. To be specific, the computer device performs row address resolution on a faulty row, and replaces the faulty row with a redundant row, that is, points an address mapping of memory data of the faulty row to the redundant row. In this case, data of the redundant row is null.

Step 202: The computer device starts a memory area read operation. To be specific, the computer device reads data in a plurality of banks, including a first bank in which the redundant row is located, by performing a memory read operation on the redundant row. When reading the data in the redundant row, the computer device determines, based on data read from other banks, that the data in the redundant row is erroneous data (shown by a black filled square).

Step 203: The computer device performs a data error correction. To be specific, the computer device corrects the erroneous data based on the data read from the other banks.

Step 204: The computer device performs data write-back. To be specific, the computer device writes back the corrected data to the redundant row, to implement data recovery after the faulty row is replaced with the redundant row.

For example, a small square shown in FIG. 2 represents 4-bit data, and the computer device reads 4-bit data from the redundant row each time to perform a correction, that is, when reading the redundant row, the computer device sequentially reads one small square included in the redundant row. Assuming that the computer device reads a second small square shown in FIG. 2, that is, 4-bit data in a position in which the black filled square is located, after correcting the 4-bit data corresponding to the black filled square based on the data read from the other banks, the computer device obtains the corrected data, and writes back the corrected data to the position in which the black filled square is located in the redundant row. Then the computer device reads a small square after the black filled square in the redundant row, that is, 4-bit data in a third small square, performs a data error correction, and writes back the data to the corresponding position. By analogy, the computer device performs actions of reading, correcting, and writing back in a sequential segment-by-segment manner, to recover the data in the redundant row.

In this embodiment of this application, after the data read from the redundant row is erroneous data, a CE is generated in the computer device, and the computer device suppresses the CE.

To be specific, because the computer device detects erroneous data when reading the redundant row, the computer device considers that a CE is detected. Because the CE is not caused by a memory fault of the computer device, the CE needs to be suppressed, that is, the CE is not handled, or the computer device does not record the CE.

Optionally, the computer device suppresses the CE in the process from triggering the read operation on the redundant row to completion of data recovery of the redundant row.

Optionally, the computer device releases the suppression operation on the CE after recovery of the data in the redundant row is completed. To be specific, the CE generated after the redundant row is recovered by the computer device is caused by a real memory fault. Therefore, the CE needs to be handled, that is, the suppression operation on the CE is released, and the CE is recorded.

It should be noted that, normally, each time the computer device generates a CE, a CE interruption occurs, and fault information of the generated CE is recorded in a memory fault log. However, in this embodiment of this application, the CE is suppressed in a read operation process, and the computer device does not record the fault information of the CE generated in the process in the memory fault log.

Figure 3:
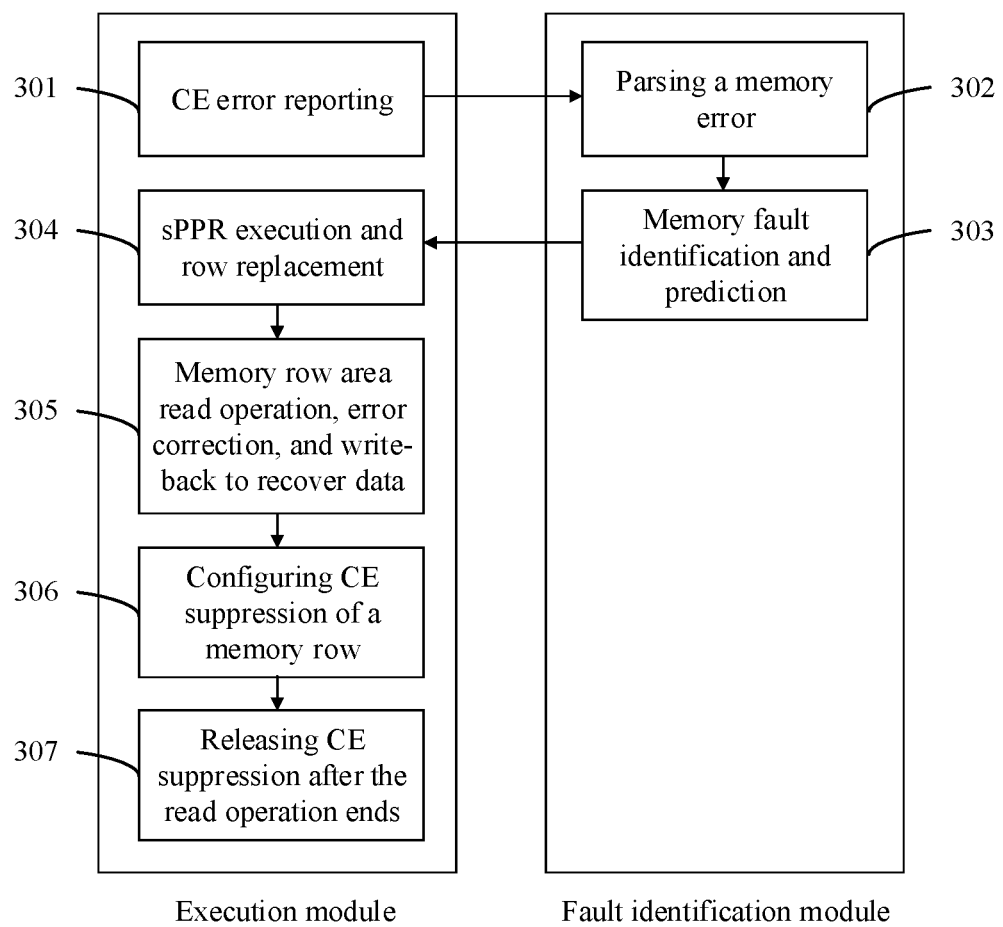
FIG. 3 is a flowchart of another memory fault handling method according to an embodiment of this application.

In an embodiment of this application, a computer device implements the foregoing functions by using modules. Referring to FIG. 3, the computer device includes an execution module and a fault identification module. The computer device implements the memory fault handling method by using the execution module and the fault identification module. The method includes the following steps.

Step 301: The execution module detects a memory fault, and reports fault information (including a fault location and fault time) of the current memory fault to the fault identification module, that is, reports a CE error, to trigger the fault identification module to start fault analysis.

Step 302: The fault identification module parses the memory fault, that is, parses historical fault information, for example, parses a physical address (fault location).

Step 303: The fault identification module performs memory fault identification and prediction, that is, determines a fault mode through analysis based on the historical fault information, or determines a fault mode and a fault level, and when the determined fault mode satisfies a memory fault recovery condition, or when the determined fault mode and the determined fault level satisfy a memory fault recovery condition, triggers the execution module to perform memory fault recovery.

Step 304: The execution module performs sPPR to replace a faulty row of the memory, that is, replaces the faulty row with a redundant row.

Step 305: The execution module starts a memory row area read operation, a data error correction, and data write-back to recover data in the redundant row, that is, recover faulty data by performing the memory read operation on the redundant row.

Step 306: The execution module configures CE suppression of the memory row, to suppress a CE in the process of performing the read operation on the redundant row.

Step 307: After the read operation on the redundant row ends, the execution module releases CE suppression, that is, releases CE suppression after data recovery.

Optionally, the execution module is a memory control module in a memory controller (for example, a double data rate synchronous dynamic random access memory controller (DDRC)) in a processor included in the computer device, and the fault identification module is a newly added module on a chip on which a BMC is located. Alternatively, the fault identification module may be added to any processing device included in the computer device.

Figure 4:
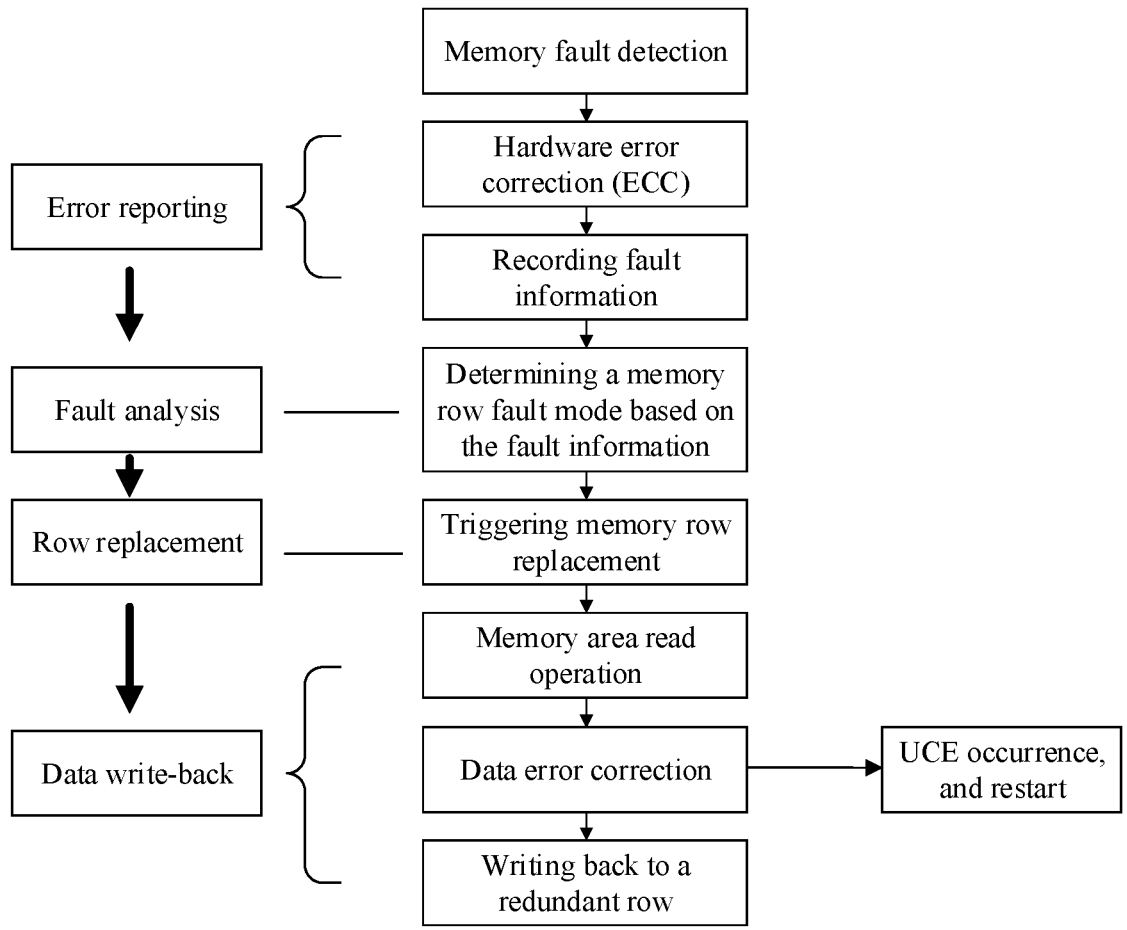
FIG. 4 is a flowchart of still another memory fault handling method according to an embodiment of this application.

FIG. 4 is a flowchart of still another memory fault handling method according to an embodiment of this application. On a basis of FIG. 3, referring to FIG. 4, the method mainly includes error reporting, fault analysis (identification), row replacement, and data write-back.

An error reporting process includes: when detecting that a memory fault occurs, the execution module performs a hardware error correction (such as ECC), reports fault information (including a fault time and fault location) of the current memory fault to the fault identification module, and reports the fault information to a module configured to record a memory fault log, to record the fault information of the current memory fault.

A fault analysis process includes: the fault identification module identifies a fault mode (or identifies a fault mode and a fault level) of the memory fault based on the received fault information and the memory fault log, and when identifying and determining that the fault mode is a memory row fault (or identifying and determining the fault mode as a memory row fault and the fault level as a high risk level), triggers the execution module to replace a faulty row of the memory.

A row replacement process includes: the execution module triggers the memory row replacement, that is, replaces the faulty row with a redundant row.

A data write-back process includes: the execution module performs a memory area read operation on the redundant row, corrects erroneous data in the redundant row by using an error correction algorithm, that is, performs a data error correction, and writes back the corrected data to the redundant row. Optionally, if the data in the redundant row cannot be recovered by using the error correction algorithm, a UCE may occur. Consequently, the computer reports breakdown and restart.

In summary, in this embodiment of this application, a fault analysis result is obtained by analyzing historical fault information, and then memory fault recovery is performed based on the fault analysis result. In this solution, a memory fault can be analyzed more accurately. In addition, in this solution, memory fault recovery can be started without cold reset, and the memory fault can be recovered in time, thereby preventing system breakdown and reducing adverse impact on services.

As described above, after a fault analysis result is obtained by analyzing fault information of a first memory row in a historical time period, an implementation of starting fault recovery for the memory by the computer device is: when the fault mode is a memory row fault, or when the fault mode is a memory row fault and the fault level is a high risk level, starting fault recovery for the memory, where the fault recovery is replacing a faulty row with a redundant row and recovering data in the redundant row. In other embodiments, the computer device obtains a fault analysis result by analyzing fault information of a second bank in the historical time period. Correspondingly, an implementation of starting fault recovery for the memory by the computer device is: when the fault mode is a memory bank fault, or when the fault mode is a memory bank fault and the fault level is a high risk level, starting fault recovery for the memory, where the fault recovery is: replacing a faulty bank with a redundant bank, and recovering data in the redundant bank.

When memory fault analysis is started after detection of the current memory fault, the second bank is a bank containing a memory row in which the current memory fault occurs, or the second bank is a bank in a memory chip containing the memory row in which the current memory fault occurs, or the second bank is any bank in the memory. When memory fault analysis is periodically started, the second bank is a bank containing a memory row in which a recent memory fault occurs, or the second bank is a bank in a memory chip containing a memory row in which a recent memory fault occurs, or the second bank is any bank in the memory.

Figure 5:
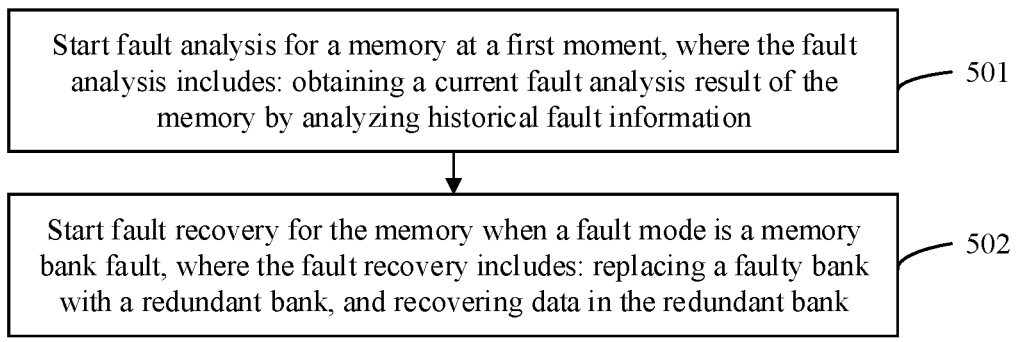
FIG. 5 is a flowchart of still another memory fault handling method according to an embodiment of this application.

This embodiment is described hereinafter with reference to FIG. 5. FIG. 5 is a flowchart of a memory fault handling method according to an embodiment of this application. The method is applied to a computer device. Referring to FIG. 5, the method includes the following steps.

Step 501: Start fault analysis for a memory at a first moment, where the fault analysis includes: obtaining a current fault analysis result of the memory by analyzing historical fault information.

In this embodiment of this application, when detecting that a memory fault occurs, the computer device analyzes the historical fault information to obtain a fault analysis result. Alternatively, the computer device periodically analyzes the historical fault information to obtain a fault analysis result. Alternatively, the computer device periodically analyzes the fault information to obtain a fault analysis result, and if it is detected that a memory fault occurs within a periodic interval, analyzes the historical fault information to obtain a fault analysis result, and restarts periodic analysis based on a time at which the memory fault is detected this time. Alternatively, the computer device periodically analyzes the historical fault information to determine a fault mode, and if it is detected that a memory fault occurs within a periodic interval, analyzes the historical fault information to obtain a fault analysis result, but does not restart periodic analysis based on a time at which the memory fault is detected this time, that is, the periodic analysis is not affected.

It should be noted that the historical fault information is fault information of a memory fault that occurs in a historical time period, and that duration of the historical time period is the same as or different from the duration of the historical time period in the foregoing embodiment. Because it is necessary to analyze whether a relatively severe memory bank fault exists, when the duration of the historical time period is longer than the duration of the historical time period in the foregoing embodiment, analysis of the memory bank fault is more accurate to some extent.

Optionally, in this embodiment of this application, the computer device analyzes the historical fault information by using a fault analysis model, to obtain the current fault analysis result of the memory, that is, the computer device inputs the historical fault information into the fault analysis model to obtain the current fault analysis result of the memory, where the fault analysis model is an intelligent calculation analysis model.

In this embodiment of this application, the fault analysis result includes the fault mode.

Optionally, the historical fault information includes a fault location and fault time of the memory fault that occurs in the historical time period. The computer device collects statistics of a fault location and fault time of a historical memory fault, to obtain a quantity of faulty bits in a second bank, that is, obtains a fourth statistical feature. When the quantity of faulty bits in the second bank in the historical time period is greater than or equal to a fourth threshold, that is, when the fourth statistical feature is greater than the fourth threshold, the computer device determines that the fault mode is a memory bank fault. The fourth threshold indicates a quantity of faulty bits tolerable in each bank.

Optionally, assuming that the computer device analyzes the historical fault information by using the fault analysis model, the fault analysis model includes the fourth threshold.

Optionally, the fault analysis result further includes a fault level, and the historical fault information further includes a fault type and/or fault error correction information of the memory fault that occurs in the historical time period. The computer device obtains a fifth statistical feature and/or a sixth statistical feature based on the historical fault information, where the fifth statistical feature indicates a quantity of faults of each fault type that occur in the second bank in the historical time period, and the sixth statistical feature indicates a quantity of error corrections that occur in the second bank in the historical time period. When the fifth statistical feature is greater than a fifth threshold, or when the sixth statistical feature is greater than a sixth threshold, or when the fifth statistical feature is greater than a fifth threshold and the sixth statistical feature is greater than a sixth threshold, it is determined that the fault level is a high risk level. The fifth threshold indicates a quantity of faults of each fault type that are tolerable in each bank, and the sixth threshold indicates a quantity of error corrections that are tolerable in each bank.

Optionally, assuming that the computer device analyzes the historical fault information by using the fault analysis model, the fault analysis model further includes the fifth threshold and/or the sixth threshold.

Optionally, the duration of the historical time period and/or the fourth threshold and/or the fifth threshold and/or the sixth threshold are/is variables that are set based on a risk mode.

Optionally, the risk mode includes a memory high risk mode and a memory low risk mode, and duration of a historical time period of the memory high risk mode is shorter than duration of a second time period of the memory low risk mode; and/or a fourth threshold of the memory high risk mode is less than a second threshold of the memory low risk mode; and/or a fifth threshold of the memory high risk mode is less than a sixth threshold of the memory low risk mode; and/or a sixth threshold of the memory high risk mode is less than a sixth threshold of the memory low risk mode.

Optionally, the computer device further provides an interaction interface, and a risk mode option is displayed on the interaction interface. The risk mode option includes a high risk mode option and a low risk mode option. A user may select a risk mode on the interaction interface based on a service risk requirement.

Optionally, when it is determined that the fault mode is the memory bank fault, the interaction interface is further configured to prompt that a memory fault risk exists.

It should be noted that a difference between this embodiment and the foregoing embodiment in FIG. 1 is as follows: The second bank in this embodiment and the first memory row in the embodiment in FIG. 1 are concepts at a same level. In the embodiment in FIG. 1, the fault mode of the memory fault is analyzed at a granularity of a memory row, but in the embodiment in FIG. 5, the fault mode of the memory fault is analyzed at a granularity of a bank. For an implementation of determining the fault mode by the computer device in FIG. 5, refer to related content in the embodiment in FIG. 1. Details are not described herein again.

Step 502: Start fault recovery for the memory when the fault mode is the memory bank fault, where the fault recovery includes: replacing a faulty bank with a redundant bank, and recovering data in the redundant bank.

In this embodiment of this application, if the computer device determines that the fault mode is the memory bank fault, the computer device replaces the faulty bank with the redundant bank in the memory, and recovers the faulty data, where the faulty bank is a bank in which a memory fault occurs.

Optionally, the redundant bank and the faulty bank are located on a same channel in the memory.

A difference between the embodiment shown in FIG. 5 and the embodiment in FIG. 1 is as follows: In the embodiment in FIG. 1, the faulty row is replaced with the redundant row, and the redundant row and the faulty row are in the same bank, but in the embodiment in FIG. 5, the faulty bank is replaced with the redundant bank, and the redundant bank and the faulty bank are on the same channel in the memory.

It should be noted that the memory includes a plurality of channels (channels), where each channel includes a plurality of dual inline memory modules (DIMMs), one DIMM includes a plurality of ranks, one rank includes a plurality of chips (memory chips), and one chip includes a plurality of banks.

In summary, in this embodiment of this application, the current fault mode of the memory is determined by analyzing the historical fault information; and when the fault mode is the memory bank fault, the faulty bank is replaced with the redundant bank, and data recovery is performed. In this solution, the fault mode can be identified more accurately, the memory bank can be replaced without cold reset, and the memory fault can be recovered in time, thereby preventing system breakdown and reducing adverse impact on services.

Figure 6:
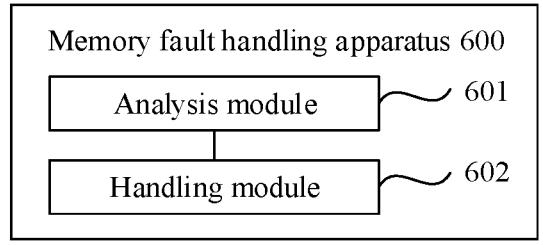
FIG. 6 is a schematic diagram of a structure of a memory fault handling apparatus according to an embodiment of this application.

FIG. 6 is a schematic diagram of a structure of a memory fault handling apparatus 600 according to an embodiment of this application. The memory fault handling apparatus 600 may be implemented as a part or an entirety of a computer device by using software, hardware, or a combination thereof. The computer device may be a computer device shown in FIG. 9 hereinafter. Referring to FIG. 6, the apparatus 600 includes an analysis module 601 and a handling module 602.

The analysis module 601 is configured to start fault analysis for a memory at a first moment, where the fault analysis includes: obtaining a current fault analysis result of the memory by analyzing historical fault information, where the historical fault information is fault information of the memory accumulated in a historical time period, and the historical time period is a time period before the first moment or a time period before the first moment and including the first moment. For a specific implementation, refer to the detailed description of step 101 in the embodiment in FIG. 1, and details are not described herein again.

The handling module 602 is configured to start fault recovery for the memory based on the current fault analysis result of the memory. For a specific implementation, refer to the detailed description of step 102 in the embodiment in FIG. 1, and details are not described herein again.

Optionally, the first moment is a moment before an uncorrectable error (UCE) fault occurs in a computer system.

Optionally, the first moment includes:
a moment of periodic starting based on a preset condition; and/or a moment of determining that a memory fault occurs in the memory after the computer system runs.

Optionally, the analysis module 601 includes:
an analysis submodule, configured to input the historical fault information into a fault analysis model to obtain the current fault analysis result of the memory, where the fault analysis model is an intelligent calculation analysis model.

Optionally, if the fault analysis result includes a fault mode, the handling module 602 includes:
a first recovery submodule, configured to start fault recovery for the memory when the fault mode is a memory row fault, where the fault recovery includes: replacing a faulty row with a redundant row, and recovering data in the redundant row. For a specific implementation, refer to the detailed description of step 102 in the embodiment in FIG. 1, and details are not described herein again.

Optionally, the analysis module 601 is specifically configured to:
obtain a first statistical feature based on the historical fault information, where the first statistical feature indicates a quantity of faulty bits that occur in a first memory row in the historical time period, the first memory row is any memory row, and the first threshold indicates a quantity of faulty bits tolerable in each memory row, where for a specific implementation, refer to the detailed description of step 101 in the embodiment in FIG. 1, and details are not described herein again; and
when the first statistical feature is greater than a first threshold, determine that the fault mode is the memory row fault.

Optionally, if the fault analysis result further includes a fault level, the handling module 602 includes:
a second recovery submodule, configured to start fault recovery for the memory when the fault mode is the memory row fault and the fault level is a high risk level.

Optionally, the analysis module 601 is further specifically configured to:
obtain a second statistical feature and/or a third statistical feature based on the historical fault information, where the second statistical feature indicates a quantity of faults of each fault type that occur in the first memory row in the historical time period, and the third statistical feature indicates a quantity of error corrections that occur in the first memory row in the historical time period, where for a specific implementation, refer to the detailed description of step 101 in the embodiment in FIG. 1, and details are not described herein again; and
when the second statistical feature is greater than a second threshold, or when the third statistical feature is greater than a third threshold, or when the second statistical feature is greater than a second threshold and the third statistical feature is greater than a third threshold, determine that the fault level is the high risk level, where the second threshold indicates a quantity of faults of each fault type that are tolerable in each memory row, and the third threshold indicates a quantity of error corrections that are tolerable in each memory row.

Figure 7:
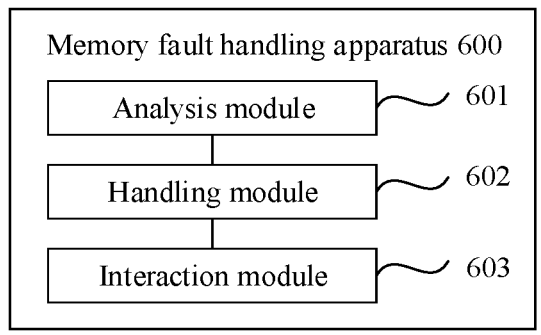
FIG. 7 is a schematic diagram of a structure of another memory fault handling apparatus according to an embodiment of this application.

Optionally, referring to FIG. 7, the apparatus 600 further includes:
an interaction module 603, configured to display a risk mode option on an interaction interface, where the risk mode option includes a memory high risk mode option and a memory low risk mode option.

Optionally, the first threshold, the second threshold, and the third threshold are variables that are set based on the risk mode.

Optionally, the first recovery submodule is specifically configured to:
perform a read operation on the redundant row; and
if the data read from the redundant row is erroneous data, correct the erroneous data, and write back the corrected data to the redundant row, to implement recovery of the data in the redundant row. For a specific implementation, refer to the detailed description of step 102 in the embodiment in FIG. 1, and details are not described herein again.

Figure 8:
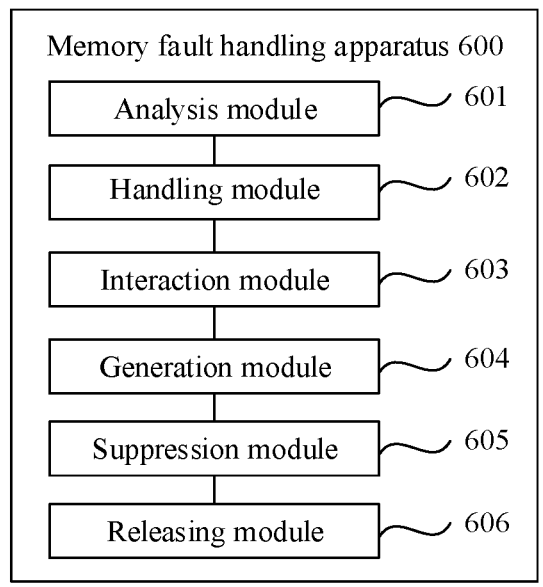
FIG. 8 is a schematic diagram of a structure of still another memory fault handling apparatus according to an embodiment of this application.

Optionally, referring to FIG. 8, the apparatus 600 further includes:
a generation module 604, configured to generate a correctable error (CE) after the data read from the redundant row is erroneous data; and
a suppression module 605, configured to suppress the CE. For a specific implementation, refer to the detailed description of step 102 in the embodiment in FIG. 1, and details are not described herein again.

Optionally, referring to FIG. 8, the apparatus 600 further includes:
a releasing module 606, configured to release the suppression operation on the CE after recovery of the data in the redundant row is completed. For a specific implementation, refer to the detailed description of step 102 in the embodiment in FIG. 1, and details are not described herein again.

Optionally, the apparatus 600 further includes:
a generation module, configured to generate a row fault isolation request after it is determined that the fault mode is the memory row fault.

Optionally, the redundant row and the faulty row are located in a same bank in the memory.

Optionally, if the fault analysis result includes a fault mode, the handling module 602 includes:
a third recovery submodule, configured to start fault recovery for the memory when the fault mode is a memory bank fault, where the fault recovery includes: replacing a faulty bank with a redundant bank, and recovering data in the redundant bank.

Optionally, the redundant bank and the faulty bank are located on a same channel in the memory.

In this embodiment of this application, a fault analysis result is obtained by analyzing the historical fault information, and then memory fault recovery is performed based on the fault analysis result. In this solution, a memory fault can be analyzed more accurately, and memory fault recovery can be started without cold reset, thereby preventing system breakdown and reducing adverse impact on services.

It should be noted that, when the memory fault handling apparatus provided in the foregoing embodiment handles a memory fault, division of the foregoing functional modules is merely used as an example for description. In actual application, the foregoing functions may be allocated to different functional modules for implementation as required. That is, an internal structure of the apparatus is divided into different functional modules to implement all or some of the functions described above. In addition, the memory fault handling apparatus provided in the foregoing embodiment and the memory fault handling method embodiments shown in FIG. 1 to FIG. 5 pertain to a same concept. For a specific implementation process of the memory fault handling apparatus, refer to the method embodiments, and details are not described herein again.

An embodiment of this application provides a computer device. The computer device stores a computer program. When the computer program is run by the computer device, the memory fault handling method in any one of the embodiments in FIG. 1 to FIG. 4 is implemented, or the memory fault handling method in the embodiment in FIG. 5 is implemented. For a specific implementation, refer to detailed descriptions in the method embodiments shown in FIG. 1 to FIG. 5, and details are not described herein again.

Optionally, the computer device includes a processor and a chip on which a BMC is located, where the processor includes a memory controller, the memory controller includes an execution module, the BMC on the chip on which the BMC is located includes a fault identification module, the memory controller runs the execution module to implement a corresponding function of the execution module in the embodiment in FIG. 3, and the BMC runs the fault identification module to implement a corresponding function of the fault identification module in the embodiment in FIG. 3.

Optionally, in addition to being disposed in the BMC, the fault identification module may be added to another processing device included in the computer device, to implement a corresponding function.

In this embodiment of this application, the computer device obtains a fault analysis result by analyzing historical fault information, and then performs memory fault recovery based on the fault analysis result. In this solution, a memory fault can be analyzed more accurately, and memory fault recovery can be started without cold reset, thereby preventing system breakdown and reducing adverse impact on services.

It should be noted that, when the computer device provided in the foregoing embodiment handles a memory fault, division of the foregoing functional modules is merely used as an example for description. In actual application, the foregoing functions may be allocated to different functional modules for implementation as required. That is, an internal structure of the apparatus is divided into different functional modules, to implement all or some of the functions described above. In addition, the computer device provided in the foregoing embodiment and the memory fault handling method embodiment shown in FIG. 1 or FIG. 5 pertain to a same concept. For a specific implementation process of the computer device, refer to the method embodiment, and details are not described herein again.

Figure 9:
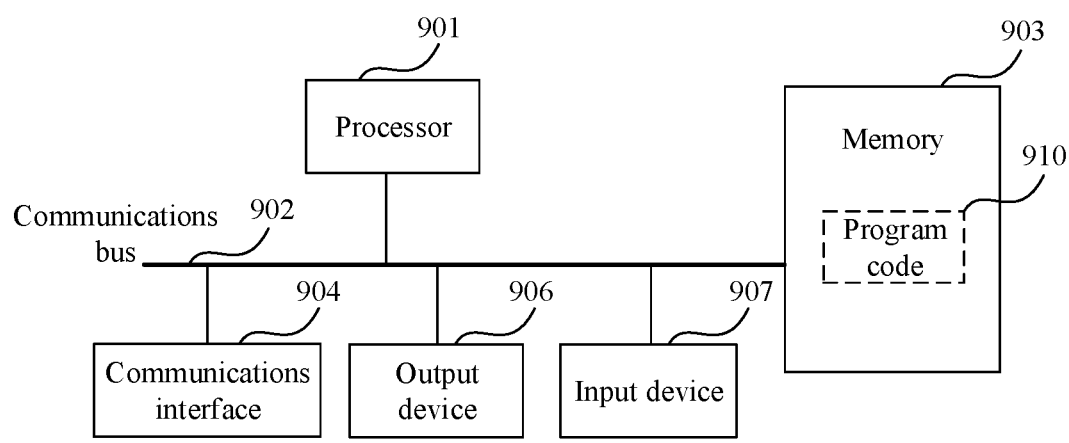
FIG. 9 is a schematic diagram of a structure of a computer device according to an embodiment of this application.

FIG. 9 is a schematic diagram of a structure of a computer device according to an embodiment of this application. The computer device includes one or more processors 901, a communications bus 902, a memory 903, and one or more communications interfaces 904.

The processor 901 is a general-purpose central processing unit (CPU), a network processor (NP), a microprocessor, or one or more integrated circuits configured to implement the solutions of this application, for example, an application-specific integrated circuit (ASIC), a programmable logic device (PLD), or a combination thereof. Optionally, the PLD may be a complex programmable logic device (CPLD), a field-programmable gate array (FPGA), generic array logic (GAL), or any combination thereof.

The communications bus 902 is configured to transfer information between the components. Optionally, the communications bus 902 may be classified into an address bus, a data bus, a control bus, and the like. For ease of representation, only one thick line is used to represent the bus in the figure, but this does not mean that there is only one bus or only one type of bus.

Optionally, the memory 903 is a read-only memory (ROM), a random access memory (RAM), an electrically erasable programmable read-only memory (EEPROM), an optical disc (including a compact disc read-only memory (CD-ROM), a compact disc, a laser disc, a digital versatile disc, a Blu-ray disc, or the like), a magnetic disk storage medium, or other magnetic storage devices, or any other medium that can be used to carry or store desired program code in a form of an instruction or a data structure and can be accessed by a computer, but is not limited thereto. The memory 903 exists independently, and is connected to the processor 901 by using the communications bus 902, or the memory 903 is integrated with the processor 901.

The communications interface 904 uses any apparatus such as a transceiver, and is configured to communicate with another device or a communications network. The communications interface 904 includes a wired communications interface, and optionally further includes a wireless communications interface. The wired communications interface is, for example, an Ethernet interface. Optionally, the Ethernet interface is an optical interface, an electrical interface, or a combination thereof. The wireless communications interface is a wireless local area network (WLAN) interface, a cellular network communications interface, or a combination thereof, or the like.

Optionally, in some embodiments, the computer device includes a plurality of processors, and each of the processors is a single-core processor or a multi-core processor. Optionally, the processor herein is one or more devices, circuits, and/or processing cores configured to process data (for example, a computer program instruction).

In specific implementation, in an embodiment, the computer device further includes an output device 906 and an input device 907. The output device 906 communicates with the processor 901 and can display information in a plurality of manners. For example, the output device 906 is a liquid crystal display (LCD), a light emitting diode (LED) display device, a cathode ray tube (CRT) display device, or a projector (projector). The input device 907 communicates with the processor 901, and can receive an input of a user in a plurality of manners. For example, the input device 907 is a mouse, a keyboard, a touchscreen device, or a sensor.

In some embodiments, the memory 903 is configured to store program code 910 for performing the solutions of this application, and the processor 901 can execute the program code 910 stored in the memory 903. The program code includes one or more software modules. The computer device can implement, by using the processor 901 and the program code 910 in the memory 903, the memory fault handling method provided in the embodiment in FIG. 1 or FIG. 5.

In other embodiments, the processor 901 stores program code for performing the solutions of this application, and the processor 901 is configured to execute the program code to implement the memory fault handling method provided in the embodiment in FIG. 1 or FIG. 5. The program code includes one or more software modules. For example, the processor 901 includes a memory controller, the memory controller stores program code, the memory controller includes the execution module and the fault identification module shown in FIG. 3, and the memory fault handling method provided in the embodiment in FIG. 1 or FIG. 5 is implemented by using the execution module and the fault identification module.

In still other embodiments, the processor 901 stores a part of program code for performing the solutions of this application. For example, the processor 901 includes a memory controller, and the memory controller includes the execution module shown in FIG. 3. The computer device further includes another processing device in addition to the processor 901. The another processing device stores another part of program code for performing the solutions of this application. The processor 901 and the another processing device jointly implement the memory fault handling method provided in the embodiment in FIG. 1 or FIG. 5. For example, the another processing device is a chip on which an out-of-band main baseboard management controller unit (BMC) is located. The BMC includes the fault identification module shown in FIG. 3. The BMC runs the fault identification module, and jointly implements with the memory controller, the memory fault handling method provided in the embodiment in FIG. 1 or FIG. 5.

All or some of the foregoing embodiments may be implemented by means of software, hardware, firmware, or any combination thereof. When software is used to implement the embodiments, the embodiments may be implemented completely or partially in a form of a computer program product. The computer program product includes one or more computer instructions. When the computer instructions are loaded and executed on the computer, the procedure or functions according to the embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD), a semiconductor medium (for example, a solid-state drive (SSD)), or the like. It should be noted that the computer-readable storage medium mentioned in this embodiment of this application may be a non-volatile storage medium, or in other words, may be a non-transitory storage medium.

It should be understood that "at least one" mentioned in this specification means one or more, and that "a plurality of" means at least two. In the description of the embodiments of this application, "/" means "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists. In addition, in the embodiments of this application, for ease of clearly describing the technical solutions in the embodiments of this application, words such as "first" and "second" are used to distinguish between same items or similar items whose functions and purposes are basically the same. A person skilled in the art may understand that words such as "first" and "second" do not limit a quantity or an execution order, and that words such as "first" and "second" are not necessarily different.

The foregoing descriptions are merely embodiments of this application, but are not intended to limit this application. Any modification, equivalent replacement, or improvement made without departing from the principle of this application should fall within the protection scope of this application.

What is claimed is:

1. A memory fault handling method, wherein the method comprises:
   starting fault analysis for a memory of a computer system at a first moment during a running period of the computer system, wherein the fault analysis comprises:
      obtaining a current fault analysis result of the memory by analyzing historical fault information, wherein the current fault analysis result comprises a fault mode, wherein the historical fault information comprises fault information of the memory accumulated in a historical time period, wherein the historical time period is a time period before the first moment or a time period before the first moment and comprising the first moment, and wherein obtaining the current fault analysis result of the memory comprises:
         obtaining a first statistical feature based on the historical fault information, wherein the first statistical feature indicates a quantity of faulty bits that occur in a memory row of the memory during the historical time period, and wherein the first statistical feature is greater than a first threshold that indicates a quantity of faulty bits tolerable in each memory row; and
         determining that the fault mode is the memory row fault; and
   starting fault recovery for the memory based on the current fault analysis result of the memory.

2. The method according to claim 1, wherein the first moment is a time before an uncorrectable error (UCE) fault occurs in the computer system.

3. The method according to claim 2, wherein the first moment comprises:
   a time of periodic starting based on a preset condition or a time of determining that a memory fault occurs in the memory after the computer system runs.

4. The method according to claim 1, wherein the obtaining a current fault analysis result of the memory by analyzing historical fault information comprises:
   inputting the historical fault information into a fault analysis model to obtain the current fault analysis result of the memory, wherein the fault analysis model is an intelligent calculation analysis model.

5. The method according to claim 1, wherein the starting fault recovery for the memory based on the current fault analysis result of the memory comprises:
   when the fault mode is a memory row fault, starting fault recovery for the memory, wherein the fault recovery comprises:
      replacing a faulty row with a redundant row; and
      recovering data in the redundant row.

6. The method according to claim 5, wherein the recovering data in the redundant row comprises:
   performing a read operation on the redundant row; and
   if the data read from the redundant row is erroneous data:

correcting the erroneous data to produce corrected data; and writing back the corrected data to the redundant row to implement recovery of the data in the redundant row.

7. The method according to claim 6, wherein when the data read from the redundant row is erroneous data, the method further comprises:

generating a correctable error (CE); and performing a suppressing operation to suppress the CE.

8. The method according to claim 7, wherein after the recovery of the data in the redundant row is completed, the method further comprises:

releasing the suppression operation on the CE.

9. The method according to claim 1, wherein the current fault analysis result further comprises a fault level, and wherein the starting fault recovery for the memory based on the current fault analysis result of the memory comprises:

when the fault mode is the memory row fault and the fault level is a high risk level, starting fault recovery for the memory.

10. The method according to claim 9, wherein the obtaining a current fault analysis result of the memory further comprises:

obtaining at least one of a second statistical feature or a third statistical feature based on the historical fault information, wherein the second statistical feature indicates a quantity of faults of each fault type that occur in the memory row in the historical time period, and the third statistical feature indicates a quantity of error corrections that occur in the memory row in the historical time period; and when the second statistical feature is greater than a second threshold, or when the third statistical feature is greater than a third threshold, or when the second statistical feature is greater than the second threshold and the third statistical feature is greater than the third threshold, determining that the fault level is the high risk level, wherein the second threshold indicates a quantity of faults of each fault type that are tolerable in each memory row, and the third threshold indicates a quantity of error corrections that are tolerable in each memory row.

11. The method according to claim 10, wherein the method further comprises:

displaying a risk mode option on an interaction interface, wherein the risk mode option comprises a high risk mode and a low risk mode.

12. The method according to claim 11, wherein the first threshold, the second threshold, and the third threshold are variables that are set based on a risk mode selected by a user on the interaction interface.

13. The method according to claim 1, wherein the current fault analysis result comprises a fault mode, and wherein the starting fault recovery for the memory based on the current fault analysis result of the memory comprises:

when the fault mode is a memory bank fault, starting fault recovery for the memory, wherein the fault recovery comprises:

replacing a faulty bank with a redundant bank; and recovering data in the redundant bank.

14. A computer device, comprising:

one or more processors; and a memory storing a program to be executed by the one or more processors, wherein the program comprises instructions that cause the computer device to perform operations comprising:

starting fault analysis for a memory of a computer system at a first moment during a running period of the computer system, wherein the fault analysis comprises:

obtaining a current fault analysis result of the memory by analyzing historical fault information, wherein the current fault analysis result comprises a fault mode, wherein the historical fault information comprises fault information of the memory accumulated in a historical time period, wherein the historical time period is a time period before the first moment or a time period before the first moment and comprising the first moment, and wherein obtaining the current fault analysis result of the memory comprises:

obtaining a first statistical feature based on the historical fault information, wherein the first statistical feature indicates a quantity of faulty bits that occur in a memory row of the memory during the historical time period, and wherein the first statistical feature is greater than a first threshold that indicates a quantity of faulty bits tolerable in each memory row; and determining that the fault mode is the memory row fault; and starting fault recovery for the memory based on the current fault analysis result of the memory.

15. The computer device of claim 14, wherein the first moment is a time before an uncorrectable error (UCE) fault occurs in the computer system.

16. The computer device of claim 15, wherein the first moment comprises: a time of periodic starting based on a preset condition or a time of determining that a memory fault occurs in the memory after the computer system runs.

17. The computer device of claim 14, wherein the obtaining a current fault analysis result of the memory by analyzing historical fault information comprises:

inputting the historical fault information into a fault analysis model to obtain the current fault analysis result of the memory, wherein the fault analysis model is an intelligent calculation analysis model.

18. The computer device of claim 14, wherein the starting fault recovery for the memory based on the current fault analysis result of the memory comprises:

when the fault mode is a memory row fault, start fault recovery for the memory, wherein the fault recovery comprises:

replacing a faulty row with a redundant row; and recovering data in the redundant row.

19. A non-transitory computer-readable storage medium storing one or more instructions executable by a computer device to perform operations comprising:

starting fault analysis for a memory of a computer system at a first moment during a running period of the computer system, wherein the fault analysis comprises:

obtaining a current fault analysis result of the memory by analyzing historical fault information, wherein the current fault analysis result comprises a fault mode, wherein the historical fault information comprises fault information of the memory accumulated in a historical time period, wherein the historical time period is a time period before the first moment or a time period before the first moment and comprising the first moment, and wherein obtaining the current fault analysis result of the memory comprises:

obtaining a first statistical feature based on the historical fault information, wherein the first statistical feature indicates a quantity of faulty bits that occur in a memory row of the memory during the historical time period, and wherein the first statistical feature is greater than a first threshold that indicates a quantity of faulty bits tolerable in each memory row; and
determining that the fault mode is the memory row fault; and starting fault recovery for the memory based on the current fault analysis result of the memory.

\* \* \* \* \*